(12) United States Patent
Archer et al.

(10) Patent No.: US 11,722,104 B2
(45) Date of Patent: Aug. 8, 2023

(54) CONTROL OF INPUT BIAS CURRENT MODULATION IN AMPLIFIERS

(71) Applicant: TEXAS INSTRUMENTS INCORPORATED, Dallas, TX (US)

(72) Inventors: Tyler James Archer, Tucson, AZ (US); Paul Gerard Damitio, Tucson, AZ (US); Joel Martin Halbert, Tucson, AZ (US); Bharath Karthik Vasan, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/462,868

(22) Filed: Aug. 31, 2021

(65) Prior Publication Data

US 2023/0060318 A1      Mar. 2, 2023

(51) Int. Cl.
*H03F 3/04*        (2006.01)
*H03F 3/26*        (2006.01)
(52) U.S. Cl.
CPC ..................... *H03F 3/04* (2013.01)

(58) Field of Classification Search
CPC ..... H03F 3/04; H03F 3/26; H03F 3/45; H03F 3/18
USPC ................. 330/252–261, 296, 310
See application file for complete search history.

(56) References Cited

U.S. PATENT DOCUMENTS 7,411,455 B2 *   8/2008   Smith .................. H03F 3/3076
                                                        330/264

* cited by examiner

*Primary Examiner* — Hieu P Nguyen
(74) *Attorney, Agent, or Firm* — Valerie M. Davis; Frank D. Cimino

(57) ABSTRACT

Examples of amplifiers use current-replication transistors and a separation circuit coupled to such transistors to separate error current components from other current components in a pre-driver of an amplifier. In response to driving the current-replication transistors with the separated error current components, replica base current components that approximate error-modulation components of the pre-driver base currents are generated. Replica-current subtraction circuitry coupled to the current-replication transistors then subtract the replica base current components from the pre-driver base currents, affecting cancellation of the error-modulation components of the pre-driver base currents.

19 Claims, 5 Drawing Sheets

CONTROL OF INPUT BIAS CURRENT MODULATION IN AMPLIFIERS

CROSS-REFERENCE TO RELATED APPLICATION(S)

This application is related to co-pending application Ser. No. 17/462,930, entitled: "CONTROL OF BASE CURRENTS FOR OUTPUT DRIVER TRANSISTORS IN AMPLIFIERS", assigned to the assignee of the present application and filed concurrently herewith. The content of this related application is incorporated by reference herein.

FIELD OF DISCLOSURE

This disclosure relates generally to control of input bias current modulation in amplifiers, and more particularly to techniques for adaptively replicating error-modulation components of the input bias current and subtracting the replica currents from the input bias current to reduce or cancel its modulation.

BACKGROUND

In an amplifier using bipolar junction transistors (BJTs), the output driver transistors have base currents that vary with output current. The base currents may be supplied by corresponding bias current elements in the amplifier. However, during operation, mismatches between the base currents of the output driver transistors and their respective bias currents may produce error currents. These error currents add to or subtract from respective fixed DC bias currents that flow through corresponding pre-driver transistors of the output stage. This, in turn, introduces an error component to the input bias current of the present stage, which may be the output stage of a multi-stage amplifier.

When negative feedback is applied in such a multi-stage amplifier, the error component of the present stage's input bias current creates a corresponding error voltage at the input of the preceding stage. The magnitude of the error voltage is dependent on the transconductance gain (gm) of the preceding stage. The nonlinear components of this input error voltage introduce undesirable distortion in the amplifier's output signal.

Previous approaches use a voltage buffer between the pre-driver and the output driver to attenuate the error currents that flow through the pre-driver. However, the additional buffering increases power dissipation and introduces undesirable forward-path phase delay. Other proposed solutions employ local feedback within the driver stage to control the required output driver base current drive, but this approach typically results in limiting available bandwidth.

Improvements in this area, particularly in reducing or canceling the input bias current modulation error, are thus desirable.

SUMMARY

In accordance with an example, an amplifier comprises a pre-driver; a separation circuit coupled to the pre-driver; and first and second current-replication transistors coupled to the separation circuit. The first and second current-replication transistors have respective control terminals. The amplifier further comprises first replica-current subtraction circuitry having an input current terminal coupled to the control terminal of the first current-replication transistor and an output current terminal coupled to the pre-driver; and second replica-current subtraction circuitry having an input current terminal coupled to the control terminal of the second current-replication transistor and an output current terminal coupled to the pre-driver.

In accordance with an example, an amplifier comprises first and second stages. The first stage includes a pre-driver, a separation circuit coupled to the pre-driver, and first and second current-replication transistors coupled to the separation circuit. The first and second current-replication transistors have respective control terminals. The second stage, which precedes the first stage, includes replica-current subtraction circuitry coupled to the first and second current-replication transistors.

In accordance with an example, a method comprises separating first and second error current components (e.g., $IERROR_{1,2}$) from other current components in a pre-driver of an amplifier; driving a first current-replication transistor of the amplifier with the first separated error current component (e.g., $IERROR_1$); generating, in response to the driving of the first current-replication transistor, a first replica base current component (e.g., $\sim IB\_IN_1$) that approximates an error-modulation component (e.g., $IB\_IN_1$) of a first pre-driver base current; driving a second current-replication transistor of the amplifier with the second separated error current component (e.g., $IERROR_2$); generating, in response to the driving of the second current-replication transistor, a second replica base current component (e.g., $\sim IB\_IN_2$) that approximates an error-modulation component (e.g., $IB\_IN_2$) of a second pre-driver base current; subtracting the first replica base current component from the first pre-driver base current; and subtracting the second replica base current component from the second pre-driver base current.

These and other features will be better understood from the following detailed description with reference to the accompanying drawings.

BRIEF DESCRIPTION OF THE DRAWINGS

Features of the disclosure may be understood from the following figures taken in conjunction with the detailed description.

DETAILED DESCRIPTION

Figure 1:
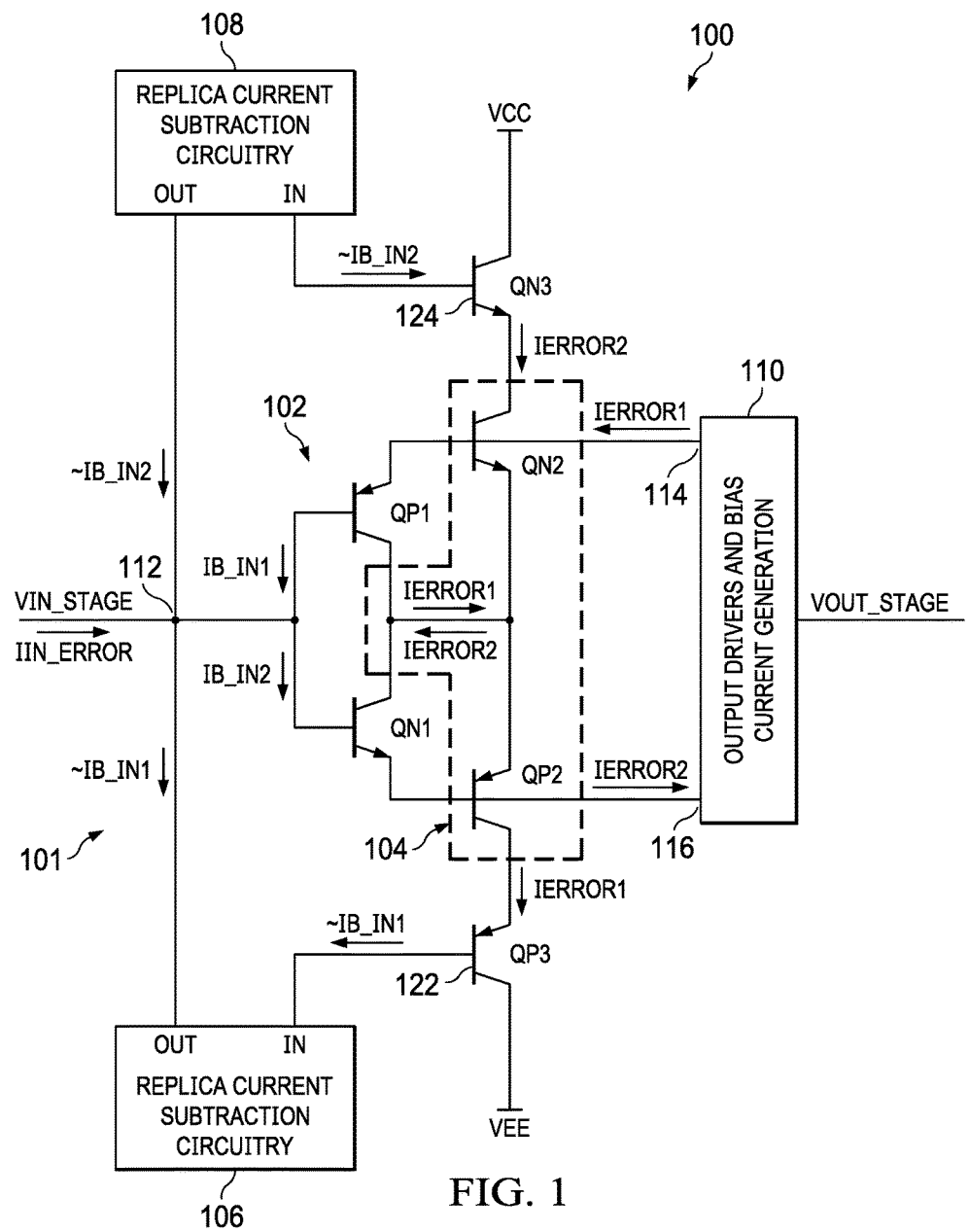
FIG. 1 is a circuit diagram of an example of an amplifier with BJTs.

Specific examples are described below in detail with reference to the accompanying figures. These examples are not intended to be limiting. In the drawings, corresponding numerals and symbols generally refer to corresponding parts unless otherwise indicated. The objects depicted in the drawings are not necessarily drawn to scale.

In example arrangements, circuits and methods are provided in which individual error-modulation components of a stage's input bias current are replicated, and then subtracted from the input bias current to reduce or cancel its modulation. In an example, replication of the individual error-modulation components is performed using a separation circuit and current-replication transistors. In an example, the subtraction is performed using current-subtraction mirrors. With no voltage buffers disposed between a pre-driver and an output driver, example arrangements described herein have low forward-path phase delay. This, in turn, avoids degradation of phase margin that would require additional compensation. In examples with no voltage buffers, power consumption is reduced. In examples, the stage may operate over a wide range of signal frequencies. In examples, both even-order and odd-order harmonic distortion are reduced.

FIG. 1 is a circuit diagram of an example BJT amplifier 100 ("amplifier 100"). Amplifier 100 may include a stage 101. Stage 101 may include a pre-driver 102, a separation circuit 104, first and second current-replication transistors QP3 and QN3, respectively, and first and second replica-current subtraction circuitry 106 and 108, respectively. Amplifier 100 may also include output drivers and bias current generation circuitry 110. The output voltage of stage 101 is denoted VOUT_STAGE, which is generated at an output terminal of stage 101. In an example, amplifier 100 may have a succeeding stage (not shown) coupled to the output terminal of stage 101.

Pre-driver 102 may include two pre-driver transistors QP1 and QN1. QP1 may be a p-type bipolar junction transistor (BJT), i.e. a PNP transistor, and QN1 may be an n-type BJT, i.e. an NPN transistor. The control terminals of QP1 and QN1 may be commonly coupled to form an input terminal 112 of stage 101 of amplifier 100. The input voltage of stage 101 is denoted VIN_STAGE. In an example, amplifier 100 may have a preceding stage (not shown) coupled to the input terminal of stage 101.

In examples described herein, a transistor with "P" in its identifier indicates that such transistor is a PNP transistor, and a transistor with "N" in its identifier indicates that such transistor is an NPN transistor.

Separation circuit 104 may include a first current-separation transistor QP2 and second current-separation transistor QN2. In an example, QN2 has a control terminal coupled to a current terminal (i.e. emitter) of QP1 and to a first current terminal 114 of output drivers and bias current generation circuitry 110. In an example, QP2 has a control terminal coupled to a current terminal (i.e. emitter) of QN1 and to a second current terminal 116 of circuitry 110. QN2 and QN3 are coupled via current terminals. For example, the emitter of QN3 is coupled to the collector of QN2. QP2 and QP3 form a similar current terminal coupling in which the emitter of QP3 is coupled to the collector of QP2. In an example, the collector of second current-replication transistor QN3 is coupled to a first voltage supply VCC, which may be a positive voltage supply. In an example, the collector of first current-replication transistor QP3 is coupled to a second voltage supply VEE, which may a negative voltage supply or ground.

In an example, first and second replica-current subtraction circuitry 106 and 108 are implemented as first and second current-subtraction current mirrors, respectively. In an example, the input/output ratio of the currents of each of first and second current mirrors 106 and 108 is 1:1. First current mirror 106 has an input current terminal (IN) that is coupled to a control terminal 122 of first current-replication transistor QP3, and second current mirror 108 has an input current terminal (IN) that is coupled to a control terminal 124 of second current-replication transistor QN3. Each current mirror 106 and 108 has an output current terminal (OUT) coupled to input terminal 112, which is commonly coupled to the control terminals of pre-driver transistors QP1 and QN1.

Circuitry 110 may include output drivers, e.g., output driver transistors, and circuitry for generating bias currents that supply base currents of the output driver transistors. The error-modulation currents IERROR1 and IERROR2 result from mismatches between the base currents of the output driver transistors and their respective bias currents. When present, these error-modulation currents, IERROR1 and IERROR2, create an error-modulation component IIN_ERROR of the input bias current of amplifier stage 101. Amplifier stage 101 is configured to eliminate or greatly reduce these error-modulation currents.

Separation circuit 104 is configured to separate error-modulation current components (IERROR$_{1,2}$) from other current components of pre-driver 102. QN2 separates IERROR$_2$, which flows between a current terminal of QN1 and current terminal 116 of circuitry 110. QP2 separates IERROR$_1$, which flows between a current terminal of QP1 and current terminal 114 of circuitry 110. IERROR$_2$ drives the emitter of QN3 to generate replica base current component ~IB_IN$_2$ that replicates or approximates the error-modulation component IB_IN$_2$ of QN1's base current. IERROR$_1$ drives the emitter of QP3 to generate replica base current component ~IB_IN$_1$ that replicates or approximates the error-modulation component IB_IN$_1$ of QP1's base current. Current mirror 106 is configured to subtract replica base current component ~IB_IN$_1$ from QP1's base current, and current mirror 108 is configured to subtract replica base current component ~IB_IN$_2$ from QN1's base current. Through this cancelation or subtraction process, the net error-modulation component IIN_ERROR of the stage's input bias current is reduced to approximately zero or eliminated.

Figure 2A:
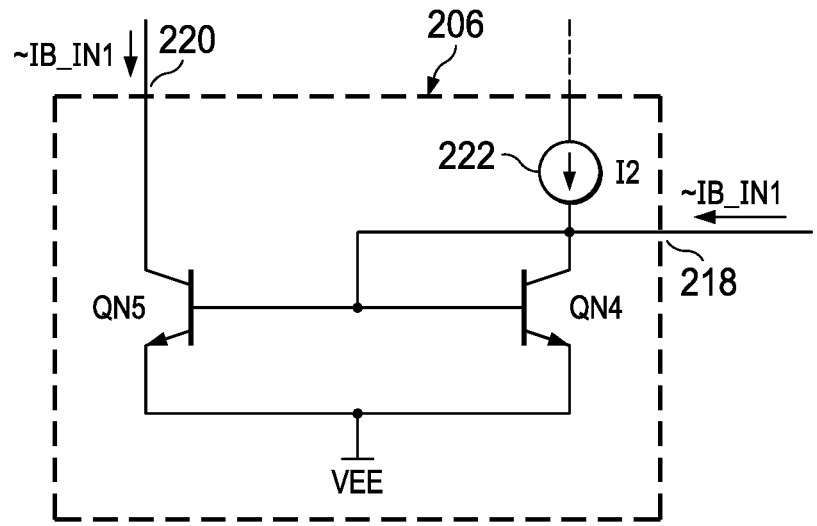
FIGS. 2A and 2B are circuit diagrams of example replica-current subtraction circuitry.
Figure 2B:
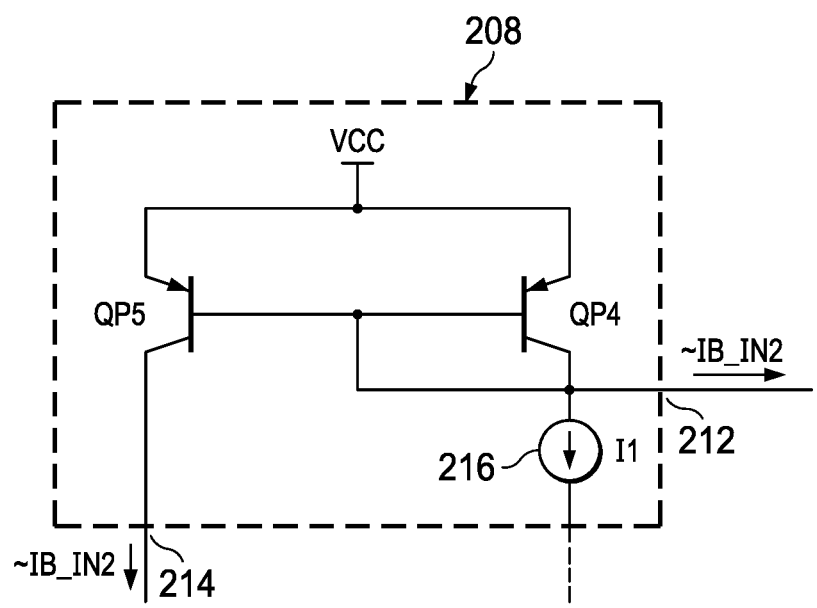

In an example, replica-current subtraction circuitry 106 and 108 may be implemented with collector-input current mirrors 206 and 208, respectively, examples of which are shown in FIGS. 2A and 2B.

FIG. 2A shows an example collector-input current mirror 206. This configuration includes two NPN transistors QN4 and QN5 having commonly coupled control terminals. Input current terminal 218 of current mirror 206 is formed at the collector of QN4, which is coupled to the common base node of QN4 and QN5. Input current terminal 218 may be coupled to the base of current-replication transistor QP3. In an example, current source 222, coupled to the collector of QN4, generates the bias current I2. Output current terminal 220 of current mirror 208 is formed at the collector of QN5 and may be coupled to input terminal 112 of stage 101. The emitters of QN4 and QN5 are commonly coupled to each other and to VEE.

FIG. 2B shows another example collector-input current mirror 208 in which two PNP transistors QP4 and QP5 are commonly coupled at their control terminals. Input current terminal 212 of current mirror 208 is formed at the collector of QN4, which is coupled to the common base node of QP4 and QP5. Input current terminal 212 may be coupled to the base of current-replication transistor QP3. In an example, current source 216, coupled to the collector of QP4, generates the bias current I1. Output current terminal 214 of current mirror 208 is formed at the collector of QP5 and may be coupled to input terminal 112 of stage 101. The emitters of QP4 and QP5 are commonly coupled to each other and to VCC.

In other examples, current sources 222 and 216 may be omitted from their respective current mirrors 206 and 208 to minimize quiescent outputs of the current mirrors, which may reduce the noise added to the amplifier signal.

Figure 3A:
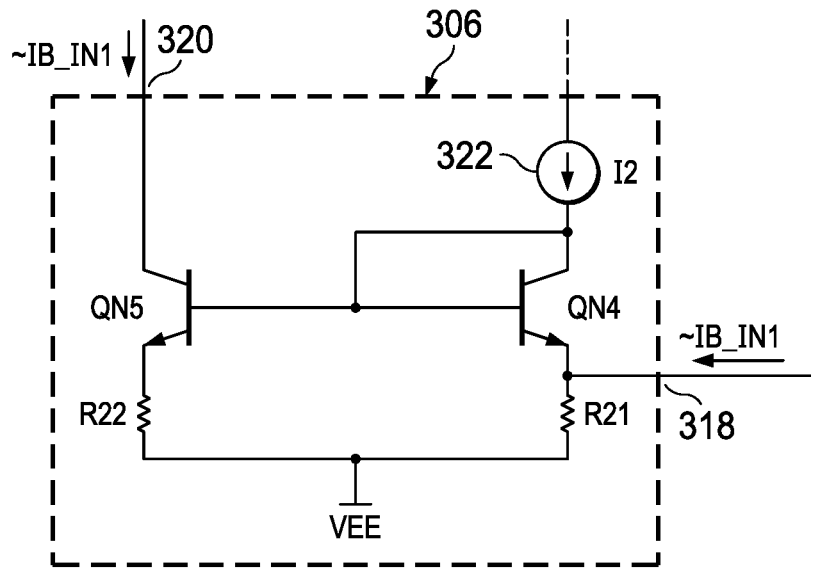
FIGS. 3A and 3B are circuit diagrams of other example replica-current subtraction circuitry.
Figure 3B:
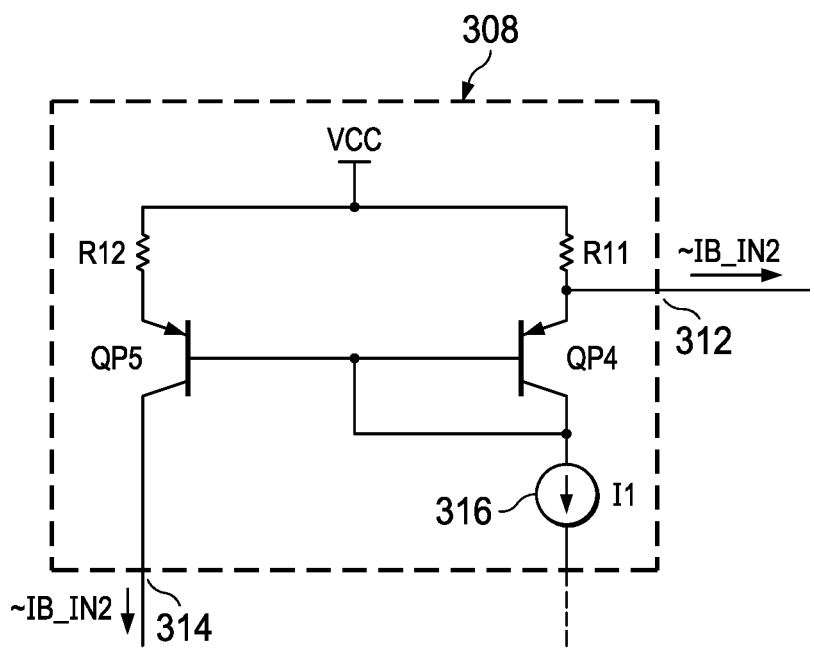

In an example, replica-current subtraction circuitry 106 and 108 may be implemented with emitter-input current mirrors 306 and 308, respectively, examples of which are shown in FIGS. 3A and 3B.

Current mirror 306 is similar in configuration to current mirror 206 but different in some respects. Resistors R21 and R22 are coupled to the emitters of QN4 and QN5, respectively. The other end of each of R21 and R22 is coupled to VEE. Also, input current terminal 318 is formed at the emitter of QN4, rather than at the collector as in current mirror 206. In an example, current source 322, coupled to the collector of QN4, generates the bias current I2. Output current terminal 320 of current mirror 306 is formed at the collector of QN5.

Current mirror 308 is similar in configuration to current mirror 208 but different in some respects. Resistors R11 and R12 are coupled to the emitters of QP4 and QP5, respectively. The other end of each resistor R21 and R22 is coupled to VCC. Also, input current terminal 312 is formed at the emitter of QP4, rather than at the collector as in current mirror 208. In an example, current source 316, coupled to the collector of QP4, generates the bias current I1. Output current terminal 320 is formed at the collector of QP5.

In an example, the resistance values of each of R11, R12, R21 and R22 is in the range of 100-10 kΩ.

Figure 4:
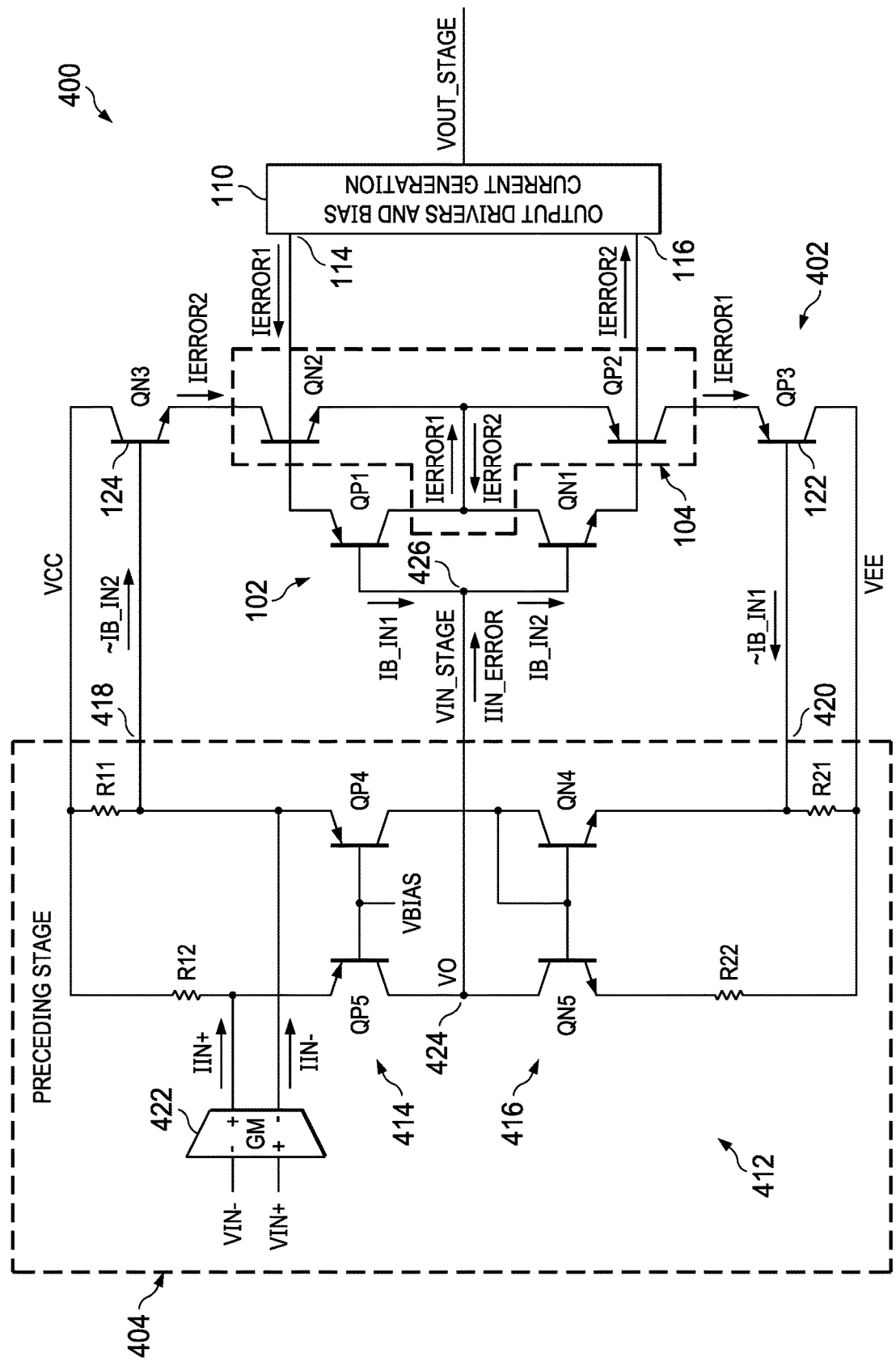
FIG. 4 is a circuit diagram of another example of an amplifier with BJTs.

FIG. 4 is a circuit diagram of an example BJT amplifier 400 ("amplifier 400"). Amplifier 400 includes a stage 402 and a preceding stage 404. Stage 402 includes some of the same elements as previously described with respect to amplifier 100, and those same elements are identified in FIG. 4 with the same identifiers as those used in FIG. 1. For example, stage 402 includes pre-driver 102, separation circuit 104, first and second current-replication transistors QP3 and QN3, respectively, and output drivers and bias current generation circuitry 110. Pre-driver 102 includes two pre-driver transistors QP1 and QN1, and separation circuit 104 includes first current-separation transistor QP2 and second current-separation transistor QN2. QP1, QN1, QP2 and QN2 are coupled to each other as described above with respect to FIG. 1. As in FIG. 1, circuitry 110 in FIG. 4 includes first and second current terminals 114 and 116, respectively.

Current terminal 114 is coupled to the control terminal of QN2, and current terminal 116 is coupled to the control terminal of QP2. QN2 and QN3 are coupled via current terminals. For example, the emitter of QN3 is coupled to the collector of QN2. QP2 and QP3 form a similar current terminal coupling in which the emitter of QP3 is coupled to the collector of QP2. In an example, the collector of first current-replication transistor QP3 is coupled to a voltage supply VEE, which may a negative voltage supply or ground, and the collector of second current-replication transistor QN3 is coupled to a voltage supply VCC, which may be a positive voltage supply.

In the example of FIG. 4, replica-current subtraction circuitry 412 is integrated in preceding stage 404. In this example, replica currents are subtracted from the input bias current through injection into preceding stage 404.

Replica-current subtraction circuitry 412 may include current source 414 and emitter-input current mirror 416, respectively. As in current mirror 306, current mirror 416 has an input current terminal 420 formed at the emitter terminal of transistor QN4 and coupled to control terminal 122 of current-replication transistor QP3. As in current mirror 308, current source 414 has an input current terminal 418 formed at the emitter terminal of transistor QP4. Input current terminal 418 is coupled to control terminal 124 of current-replication transistor QN3. In the example of FIG. 4, a bias voltage VBIAS is applied to the commonly coupled control terminals of QP4 and QP5. In an example, the resistance values of each of R11, R12, R21 and R22 may be in the range of 100-10 kΩ.

Current source 414 and current mirror 416 are coupled via the collector terminals of QP4 and QN4 and also via the collector terminals of QP5 and QN5. The commonly coupled collector terminals of QP5 and QN5 define an output terminal 424 of preceding stage 404. Output terminal 424 is coupled to input terminal 426 of stage 402, which input terminal 426 is formed by the common coupling of the control terminals of pre-driver transistors QP1 and QN1.

Preceding stage 404 may also include a differential circuit 422 configured with inputs to receive a differential voltage VIN+ and VIN−. Differential circuit 422 outputs a differential current IN+ and IN− on current paths coupled to the emitter terminals of QP5 and QP4, respectively. Preceding stage 404 generates an output voltage VO, which is applied as VIN_STAGE at input terminal 426 of stage 402. VO may be a single ended output, or a component of a differential output. The term "gm" represents the transconductance gain of differential circuit 422.

As in amplifier 100, in amplifier 400 separation circuit 104 is configured to separate error-modulation current components (IERROR$_1$ and IERROR$_2$) from other current components of pre-driver 102. In amplifier 400, QN2 separates IERROR$_2$, which drives the emitter of QN3 to generate replica base current component ~IB_IN$_2$ that replicates or approximates the error-modulation component IB_IN$_2$ of QN1's base current. QP3 separates IERROR$_1$, which drives the emitter of QP3 to generate replica base current component ~IB_IN$_1$ that replicates or approximates the error-modulation component IB_IN$_1$ of QP1's base current. Replica-current subtraction circuitry 412 is configured to subtract replica base current component ~IB_IN$_2$ from QN1's base current and to subtract replica base current component ~IB_IN$_1$ from QP1's base current. Through this cancelation or subtraction process, the net error-modulation component IIN_ERROR of the input bias current is reduced to approximately zero or eliminated.

Figure 5:
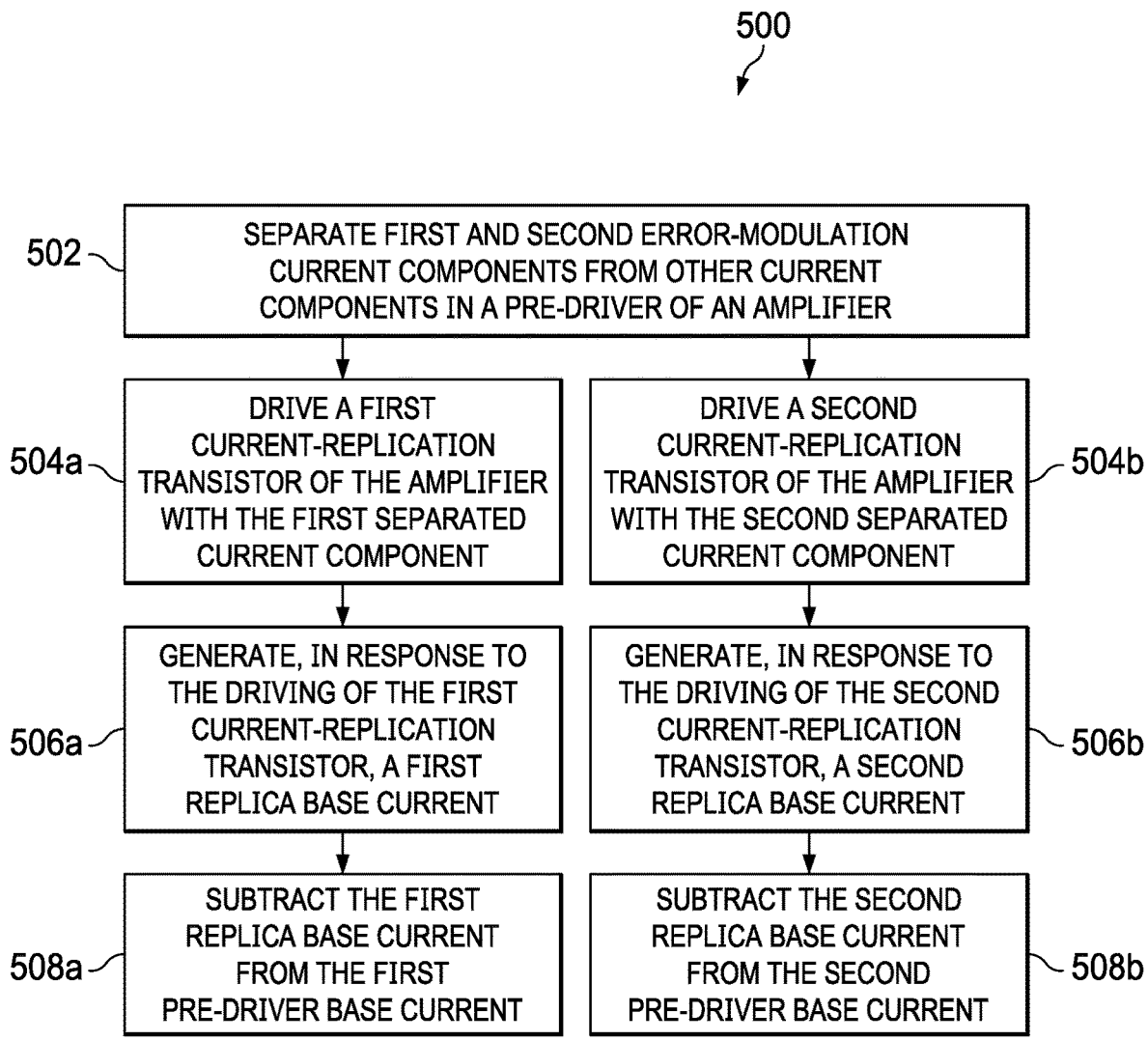
FIG. 5 is a flow diagram of an example method of operating an amplifier with BJTs.

FIG. 5 is a flow diagram of an example method 500 of operating an amplifier configured with BJTs, e.g., amplifier 100 and/or 400. In operation 502, first and second error-modulation current components (IERROR$_1$ and IERROR$_2$) are separated from other current components in a pre-driver of the amplifier. Operation 502 may be followed by two set of operations that may be performed in parallel.

One set of operations includes driving a first current-replication transistor of the amplifier with the first separated error-modulation current component (operation 504a); generating, in response to the driving of the first current-replication transistor, a first replica base current component (~IB_IN$_1$) that approximates an error-modulation component (IB_IN$_1$) of a first pre-driver base current (operation 506a); and subtracting the first replica base current component from the first pre-driver base current (operation 508a).

The other set of operations includes driving a second current-replication transistor of the amplifier with the second separated error-modulation current component (operation 504b); generating, in response to the driving of the second current-replication transistor, a second replica base current component (~IB_IN$_2$) that approximates an error-modulation component (IB_IN$_2$) of a second pre-driver base current (operation 506b); and subtracting the second replica base current component from the second pre-driver base current (operation 508b).

Operations 504a, 506a, 508a, 504b, 506b and 508b may be repeatedly performed during operation of the amplifier, and an operation in one set may not necessarily occur at the same time as its counterpart operation in the other set. Two or more operations may be combined into a single operation. Additional operations and/or alternative operations may be performed.

Various examples of amplifiers and methods reduce or cancel error-modulation components of a stage's input bias current. In an example, individual error-modulation components are replicated using a separation circuit and current-replication transistors. The replicated error-modulation components are then subtracted from the input bias current using any of various types of replica-current subtraction circuitry. Example arrangements described herein have low forward-path phase delay, as well as low power consumption. Phase margin is adequately maintained. In examples, the amplifier may operate over a wide range of signal frequencies. In examples, both even-order and odd-order harmonic distortion are reduced.

The replica-current subtraction circuitry may be integrated in the same stage as the current-replication transistors and separation circuit, or may be placed in a preceding stage. The latter configuration avoids introducing noise to the signal at the input of the present stage. Reproducing the error-modulation current components (e.g. by using current mirrors) may allow the current-replication transistors to operate over a wider range of voltages, avoiding limitation of the amplifier's output voltage swing range. Using emitter-input current mirrors for error-modulation current components or replica currents, allows even greater output voltage swing range of the present stage.

In the examples described herein, the term "control terminal(s)" refers to the base of the corresponding transistor (s).

The term "couple" is used throughout the specification. The term and derivatives thereof may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (i.e. programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the term "terminal" means "node", "interconnection", "pin" and/or "lead". Unless specifically stated to the contrary, these terms generally mean an interconnection between or a terminus of a device element, a circuit element, an integrated circuit, a device or other electronic or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (i.e. a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of bipolar junction transistors (BJTs) is described herein, other types of transistors (or equivalent devices) may be used. For example, instead of using n- and p-type BJTs, n-type metal-oxide-silicon field-effect transistors (MOSFETs) may be used instead or in addition to BJTs in the various circuits described.

Circuits described herein are reconfigurable to include the replaced components to provide functionality at least partially similar to functionality available prior to the component replacement.

Uses of the phrase "ground" in the foregoing description includes a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Modifications of the described examples are possible, as are other examples, within the scope of the claims. Moreover, features described herein may be applied in other environments and applications consistent with the teachings provided.

What is claimed is:

1. An amplifier comprising:
    a pre-driver including first and second pre-driver transistors each having a control terminal and a first current terminal, in which the control terminals are coupled together and the first current terminals are coupled together;
    a separation circuit coupled to the first current terminals of the first and second pre-driver transistors;
    first and second current-replication transistors coupled to the separation circuit, the first and second current-replication transistors having respective control terminals;
    first replica-current subtraction circuitry having an input current terminal coupled to the control terminal of the first current-replication transistor and an output current terminal coupled to the control terminals of the first and second pre-driver transistors; and
    second replica-current subtraction circuitry having an input current terminal coupled to the control terminal of the second current-replication transistor and an output current terminal coupled to the control terminals of the first and second pre-driver transistors.

2. The amplifier of claim 1, wherein the separation circuit includes:
    a first current-separation transistor coupled to the first current-replication transistor and to the pre-driver; and
    a second current-separation transistor coupled to the second current-replication transistor and to the pre-driver.

3. The bipolar amplifier of claim 2, wherein the coupling of the first current-separation transistor and the first current-replication transistor defines a first current path through which a first error current flows, and the coupling of the second current-separation transistor and the second current-replication transistor defines a second current path through which a second error current flows.

4. The amplifier of claim 2, wherein:
the first current terminals of the first and second pre-driver transistors are coupled to respective first current terminals of the first and second current-separation transistors;
a second current terminal of the first pre-driver transistor is coupled to the control terminal of the second current-separation transistor; and
a second current terminal of the second pre-driver transistor is coupled to the control terminal of the first current-separation transistor.

5. The amplifier of claim 1, wherein:
the first replica-current subtraction circuitry includes first and second NPN transistors having commonly coupled base terminals that are also coupled to a collector terminal of first NPN transistor, an emitter terminal of the first NPN transistor forming the input current terminal of the first replica-current subtraction circuitry; and
the second replica-current subtraction circuitry includes first and second PNP transistors having commonly coupled base terminals that are also coupled to a collector terminal of first PNP transistor, an emitter terminal of the first PNP transistor forming the input current terminal of the second replica-current subtraction circuitry.

6. An amplifier comprising:
a pre-driver;
a separation circuit coupled to the pre-driver;
first and second current-replication transistors coupled to the separation circuit, the first and second current-replication transistors having respective control terminals;
first replica-current subtraction circuitry having an input current terminal coupled to the control terminal of the first current-replication transistor and an output current terminal coupled to the pre-driver; and
second replica-current subtraction circuitry having an input current terminal coupled to the control terminal of the second current-replication transistor and an output current terminal coupled to the pre-driver, wherein:
a current terminal of the first current-replication transistor is driven with a first error current component to generate a first replica base current component that approximates an error-modulation component of a first pre-driver base current; and
a current terminal of the second current-replication transistor is driven with a second error current component to generate a second replica base current component that approximates an error-modulation component of a second pre-driver base current.

7. The amplifier of claim 6, wherein the separation circuit is configured to separate the first and second error current components from other pre-driver current components.

8. The amplifier of claim 6, wherein the first replica-current subtraction circuitry is configured to subtract the first replica base current component from the first pre-driver base current, and the second replica-current subtraction circuitry is configured to subtract the second replica base current component from the second pre-driver base current.

9. An amplifier comprising:
a pre-driver;
a separation circuit coupled to the pre-driver;
first and second current-replication transistors coupled to the separation circuit, the first and second current-replication transistors having respective control terminals;
first replica-current subtraction circuitry having an input current terminal coupled to the control terminal of the first current-replication transistor and an output current terminal coupled to the pre-driver; and
second replica-current subtraction circuitry having an input current terminal coupled to the control terminal of the second current-replication transistor and an output current terminal coupled to the pre-driver, wherein:
the first replica-current subtraction circuitry includes first and second NPN transistors having commonly coupled base terminals that are also coupled to a collector terminal of the first NPN transistor, the collector of the first NPN transistor forming the input current terminal of the first replica-current subtraction circuitry; and
the second replica-current subtraction circuitry includes first and second PNP transistors having commonly coupled base terminals that are also coupled to a collector terminal of the first PNP transistor, the collector of the first PNP transistor forming the input current terminal of the second replica-current subtraction circuitry.

10. An amplifier comprising:
a first stage including:
a pre-driver,
a separation circuit coupled to the pre-driver, and first and second current-replication transistors coupled to the separation circuit, the first and second current-replication transistors having respective control terminals; and
a second stage preceding the first stage, the second stage including:
replica-current subtraction circuitry coupled to the control terminals of the first and second current-replication transistors, wherein the replica-current subtraction circuitry is configured to subtract first and second replica current components that approximate error-modulation components of respective first and second base currents of the pre-driver and that are injected from the first stage into the second stage.

11. The amplifier of claim 10, wherein the replica-current subtraction circuitry includes:
an emitter-input current mirror, and
an emitter-input current source.

12. The amplifier of claim 11, wherein the emitter-input current mirror includes first and second NPN transistors commonly coupled at base terminals thereof and also coupled at a collector terminal of the first NPN transistor, the first NPN transistor including an emitter terminal forming an input current terminal of the emitter-input current mirror.

13. The amplifier of claim 11, wherein the emitter-input current source includes first and second PNP transistors commonly coupled at base terminals thereof, the first PNP transistor including an emitter terminal forming an input current terminal of the emitter-input current source.

14. The amplifier of claim 11, wherein the second stage includes a differential input circuit coupled to the emitter-input current source.

15. The amplifier of claim 11, wherein the emitter-input current mirror has an input current terminal coupled to the control terminal of the first current-replication transistor, and the emitter-input current source has an input current terminal coupled to the control terminal of the second current-replication transistor.

16. A method comprising:
separating first and second error current components from other current components in a pre-driver of an amplifier;
driving a first current-replication transistor of the amplifier with the first separated error current component;
generating, in response to the driving of the first current-replication transistor, a first replica base current component that approximates an error-modulation component of a first pre-driver base current;
driving a second current-replication transistor of the amplifier with the second separated error current component;
generating, in response to the driving of the second current-replication transistor, a second replica base current component that approximates an error-modulation component of a second pre-driver base current;
subtracting the first replica base current component from the first pre-driver base current; and
subtracting the second replica base current component from the second pre-driver base current.

17. The method of claim 16, wherein the subtracting of the first replica base current component from the first pre-driver base current is performed by first replica-current subtraction circuitry, and the subtracting of the second replica base current component from the second pre-driver base current is performed by a second replica-current subtraction circuitry.

18. The method of claim 16, comprising:
injecting the first and second replica base current components into a preceding stage of the amplifier.

19. The method of claim 18, wherein the injecting comprises:
injecting the first replica base current component into a first current path of the preceding stage, and injecting the second replica base current into a second current path of the preceding stage.

* * * * *